US012408405B2

United States Patent
Nemouchi et al.

(10) Patent No.: US 12,408,405 B2
(45) Date of Patent: Sep. 2, 2025

(54) DEVICE COMPRISING SPACERS INCLUDING A LOCALISED AIRGAP AND ASSOCIATED MANUFACTURING METHODS

(71) Applicant: COMMISSARIAT À L'ENERGIE ATOMIQUE ET AUX ENERGIES ALTERNATIVES, Paris (FR)

(72) Inventors: Fabrice Nemouchi, Grenoble (FR); Cyrille Le Royer, Grenoble (FR); Nicolas Posseme, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 449 days.

(21) Appl. No.: 17/966,217

(22) Filed: Oct. 14, 2022

(65) Prior Publication Data

US 2023/0120901 A1 Apr. 20, 2023

(30) Foreign Application Priority Data

Oct. 14, 2021 (FR) ...................................... 2110869

(51) Int. Cl.
*H10D 64/01* (2025.01)
*H01L 21/762* (2006.01)
(Continued)

(52) U.S. Cl.
CPC ......... *H10D 64/021* (2025.01); *H10D 62/115* (2025.01); *H10D 64/01* (2025.01);
(Continued)

(58) Field of Classification Search
CPC ....... H01L 21/76264–76289; H01L 21/76291; H10D 62/115; H10D 64/679;
(Continued)

(56) References Cited

U.S. PATENT DOCUMENTS

2009/0294898 A1* 12/2009 Feustel ............. H01L 21/76834
257/E21.573
2011/0163367 A1 7/2011 Kang et al.
(Continued)

FOREIGN PATENT DOCUMENTS

FR 3 049 110 A1 9/2017
KR 100706225 B1 * 4/2007 ......... H10D 84/0135

OTHER PUBLICATIONS

KR Search Report as issued in French Patent Application No. FR2110869, dated Jun. 22, 2022.

*Primary Examiner* — Britt D Hanley
*Assistant Examiner* — Jason James Greaving
(74) *Attorney, Agent, or Firm* — Pillsbury Winthrop Shaw Pittman LLP

(57) ABSTRACT

A semiconductor device made on a substrate including an active region and a non-active region at least partially surrounding the active region, a plurality of gate stacks, a part of each gate stack being on the active region, each gate stack being separated from adjacent gate stacks by a spacer by a distance e, the device being such that, for each gate stack, the part of the gate stack located on the active region has a height $h_2$, the part of the same gate stack located on the non-active region has a height $h_1$, and $h_2/e = a_2$ and $h_1/e = a_1 < a_{lim}$ where $a_2$ is an aspect ratio such that, upon growth of the spacer material forming the spacers, an airgap is in the spacer, and $a_1$ is an aspect ratio such that, upon growth of the spacer material forming the spacers, no airgap is in the spacer.

14 Claims, 12 Drawing Sheets

(51) Int. Cl.
  *H10D 62/10*   (2025.01)
  *H10D 84/01*   (2025.01)
  *H10D 84/03*   (2025.01)
  *H10D 84/83*   (2025.01)
  *H10D 86/00*   (2025.01)
  *H10D 86/01*   (2025.01)

(52) U.S. Cl.
  CPC ....... *H10D 84/0147* (2025.01); *H10D 84/038* (2025.01); *H10D 84/83* (2025.01); *H10D 86/01* (2025.01); *H10D 86/201* (2025.01); H01L 21/76283 (2013.01)

(58) Field of Classification Search
  CPC ............. H10D 64/687; H10D 48/3835; H10D 48/383; H10D 30/23; H10D 30/031
  See application file for complete search history.

(56) References Cited

U.S. PATENT DOCUMENTS

| | | |
|---|---|---|
| 2014/0110798 A1 | 4/2014 | Cai et al. |
| 2015/0091089 A1 | 4/2015 | Niebojewski et al. |
| 2019/0043950 A1 | 2/2019 | George et al. |
| 2019/0044048 A1 | 2/2019 | George et al. |
| 2019/0305081 A1* | 10/2019 | LaJoie ................ H01L 21/0228 |

* cited by examiner

[Fig. 1A]
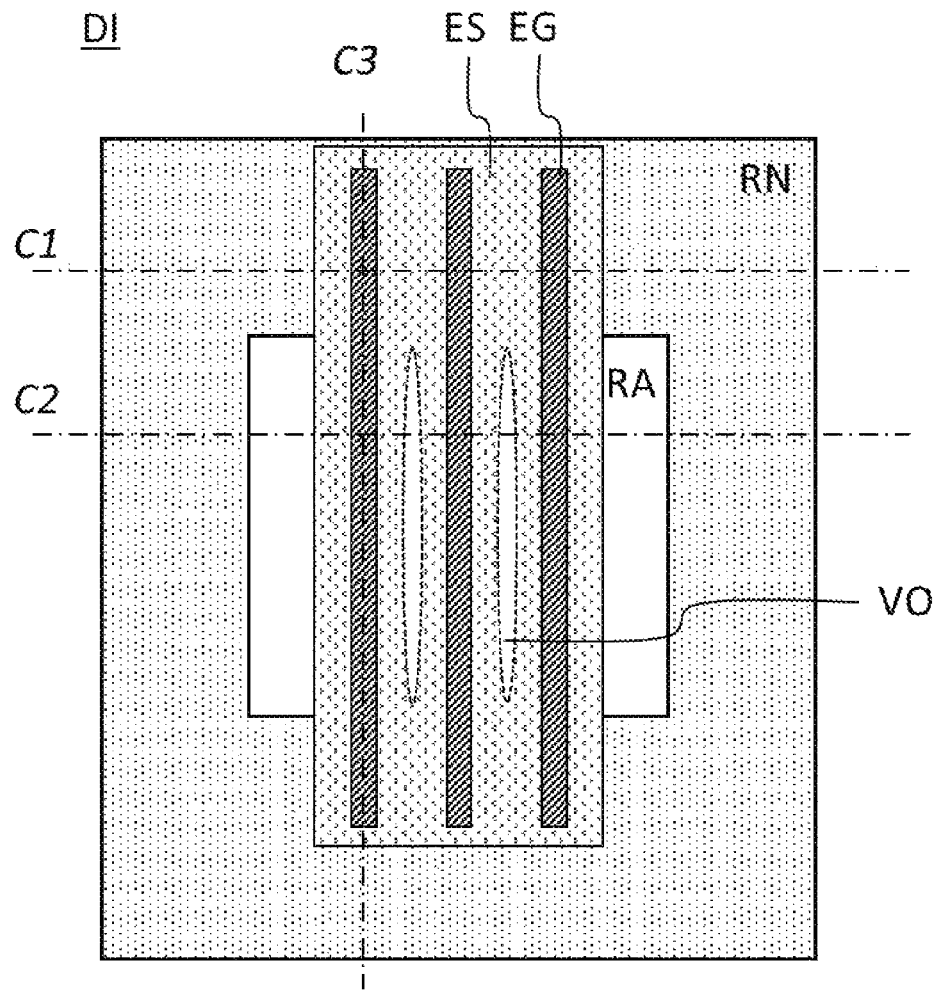
[Fig. 1B]
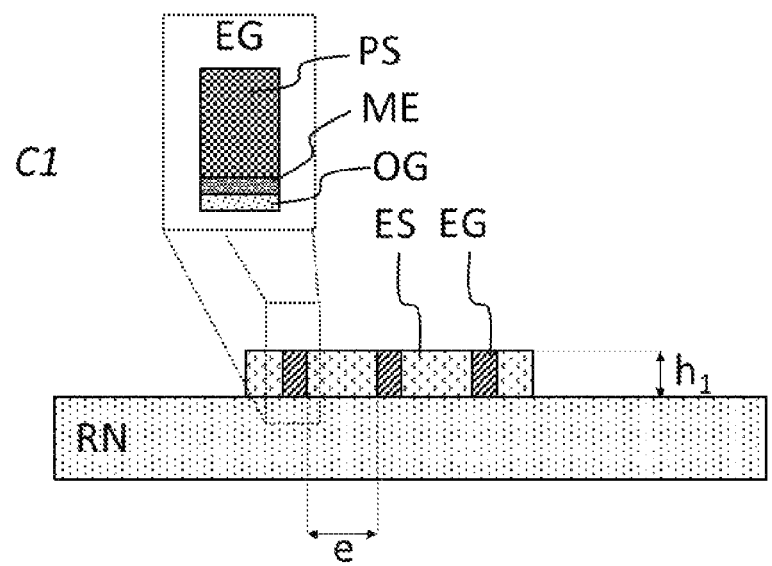

[Fig. 1C]
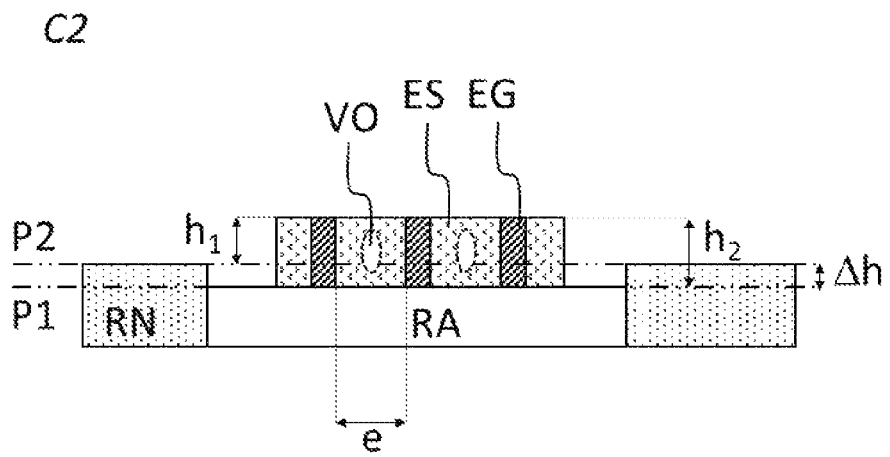
[Fig. 1D]
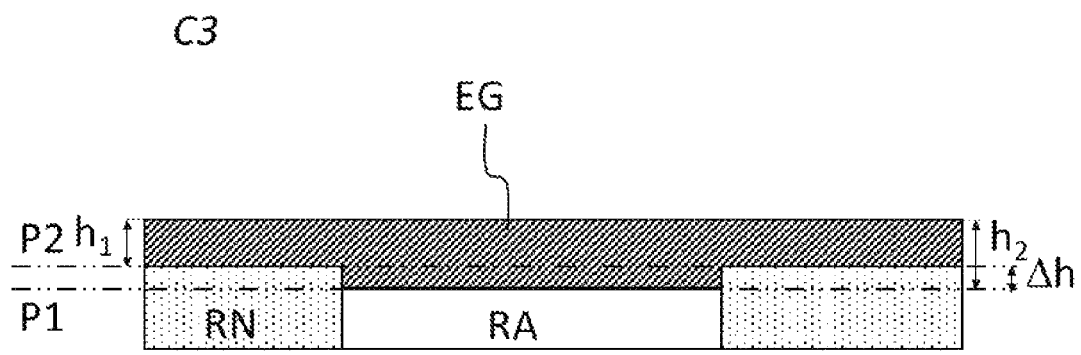

[Fig. 1E]
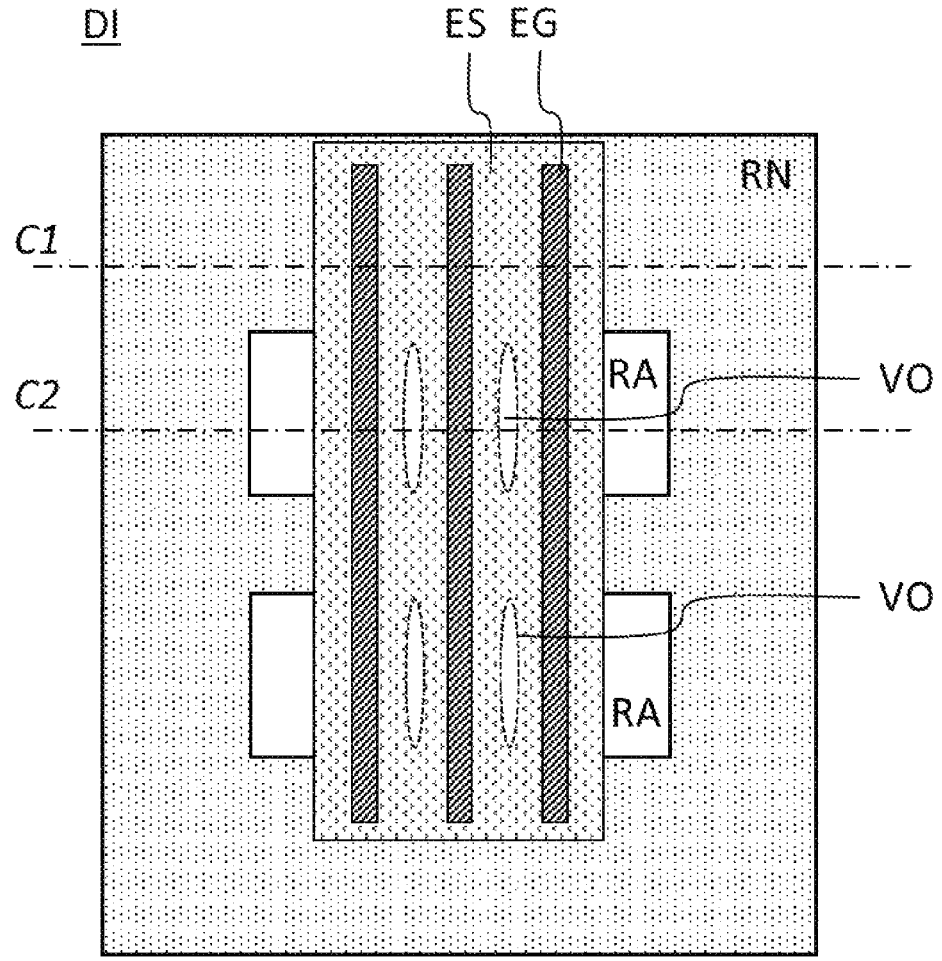
[Fig. 2A]
$h/e = a_2$
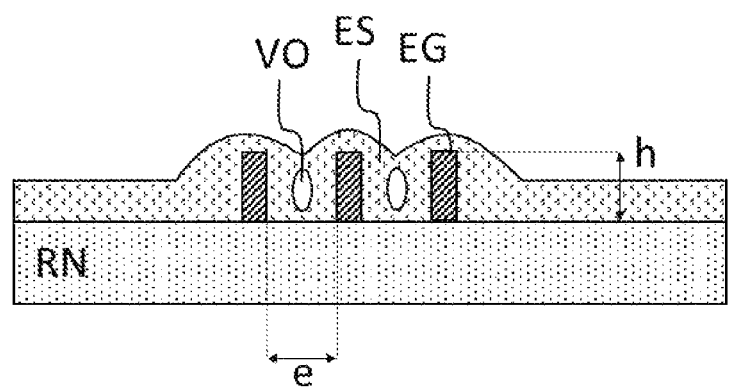

[Fig. 2B]
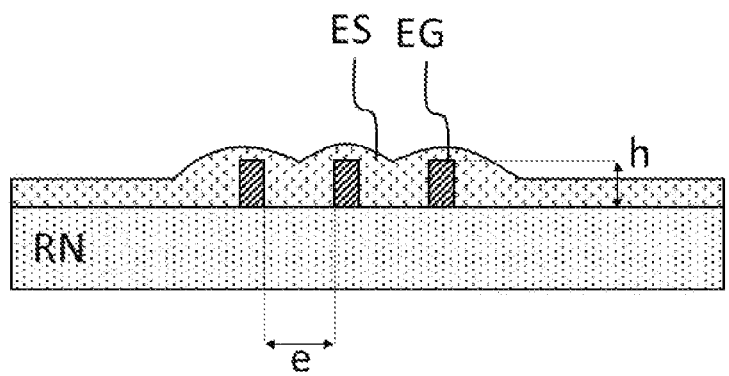
[Fig. 3]
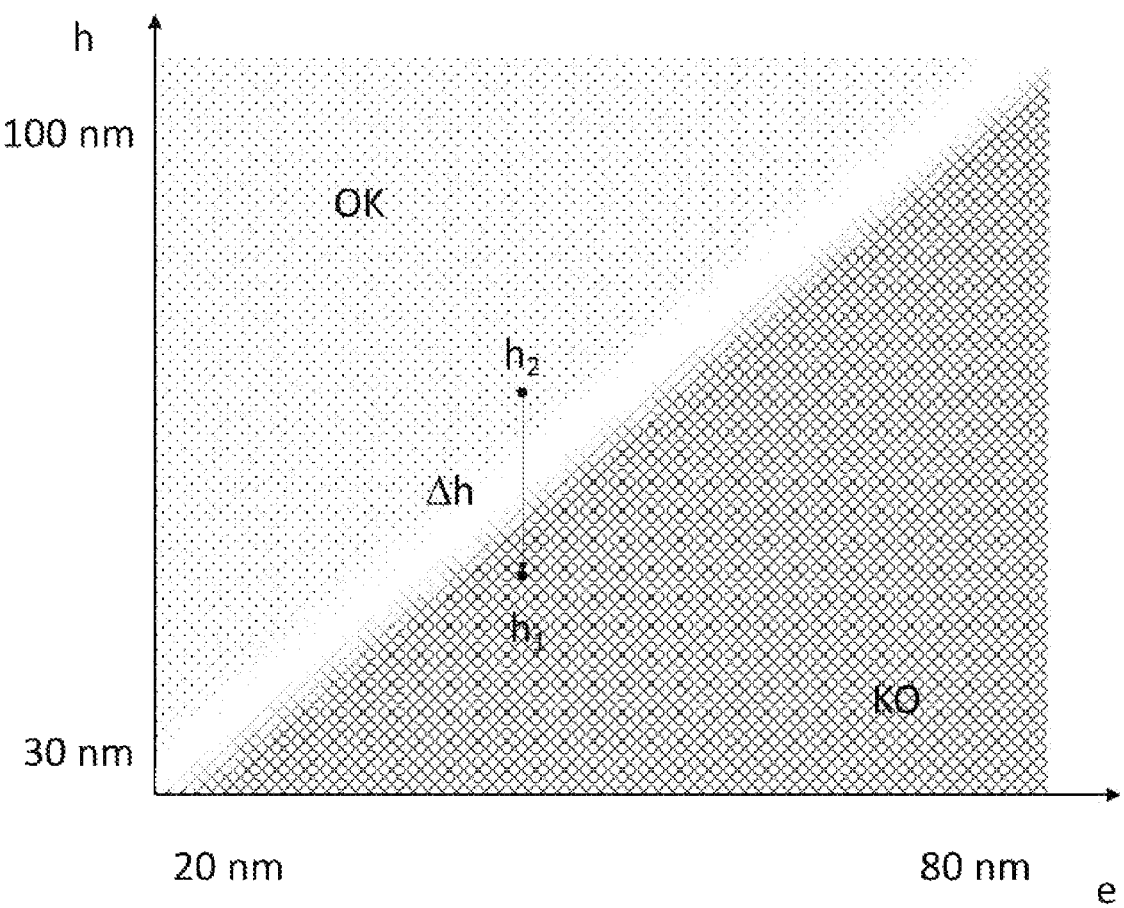

[Fig. 4]
100
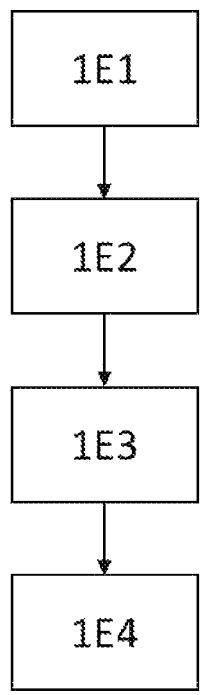
[Fig. 5]
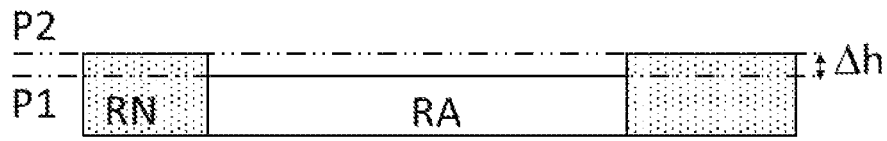
[Fig. 6A]
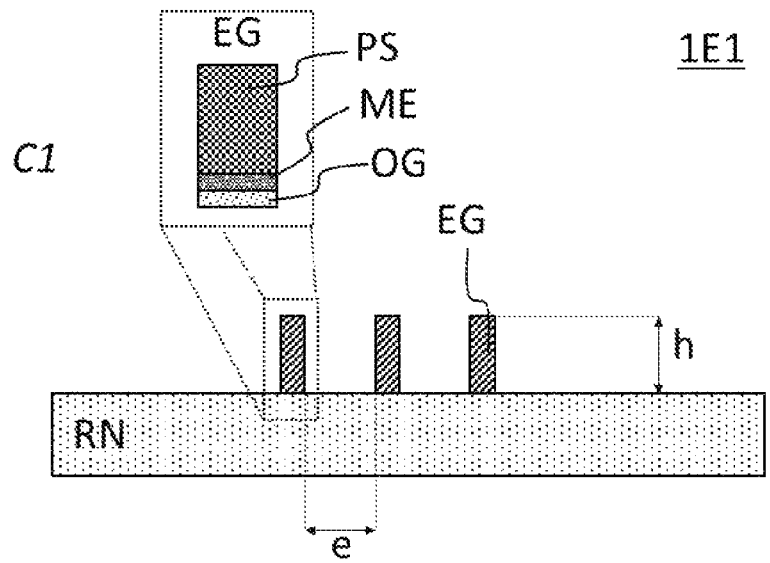

[Fig. 6B]
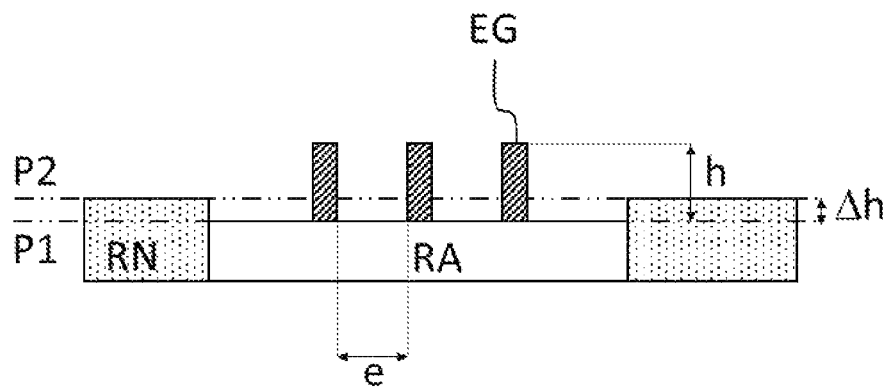
[Fig. 7A]
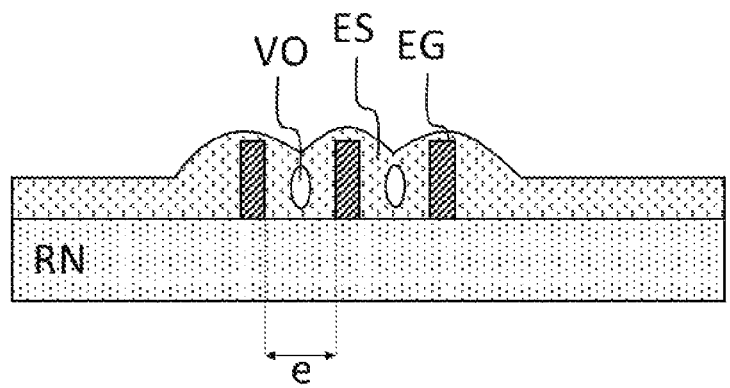

[Fig. 7B]
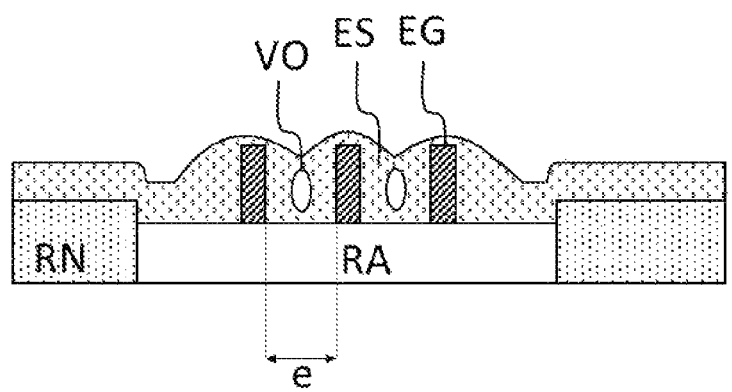
[Fig. 8A]
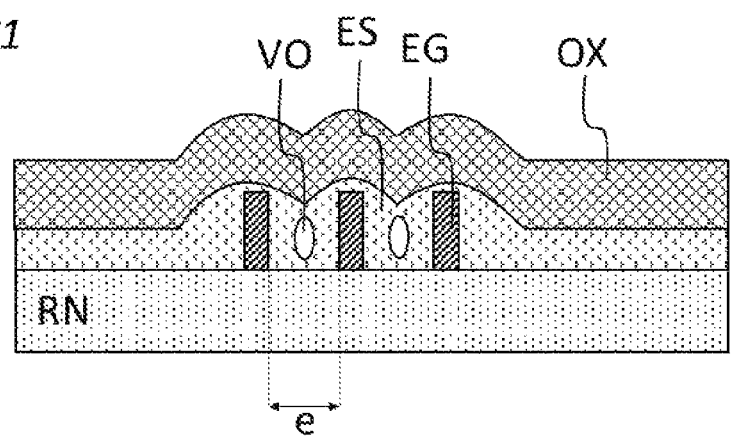

[Fig. 8B]
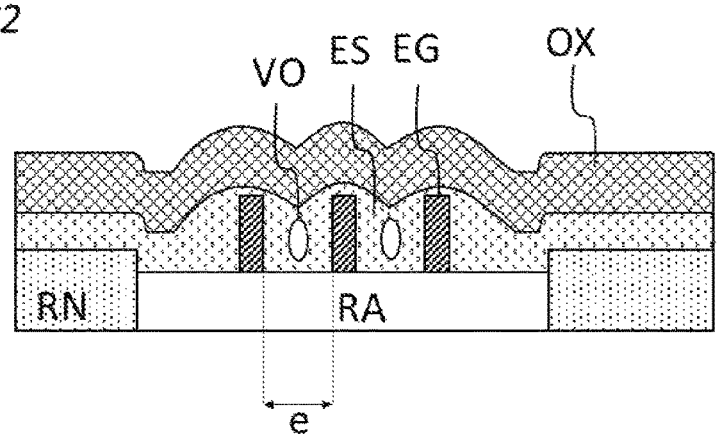
[Fig. 9A]
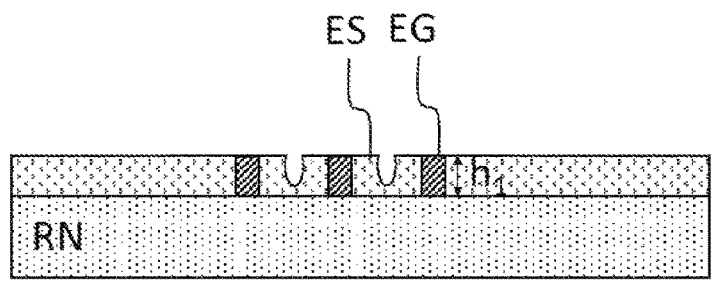
[Fig. 9B]
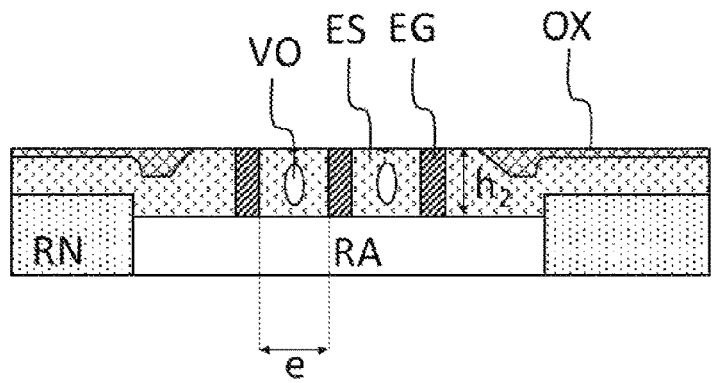

[Fig. 10]
200
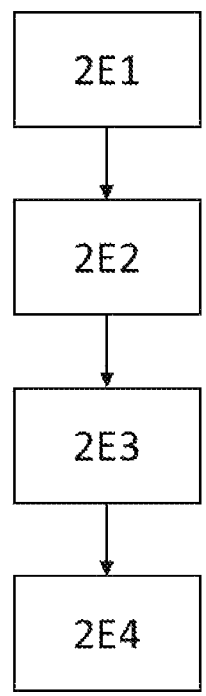
[Fig. 11A]
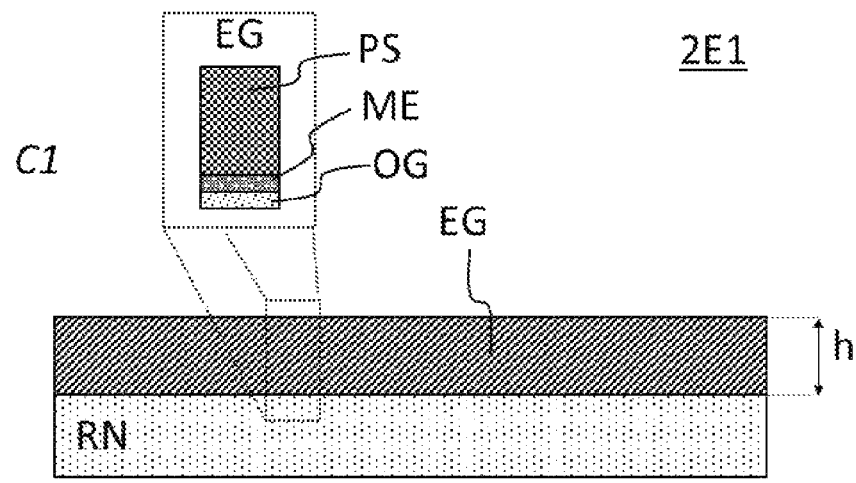

[Fig. 11B]
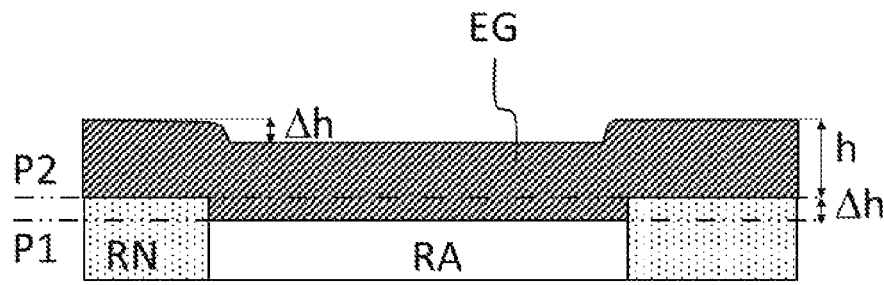
[Fig. 12A]
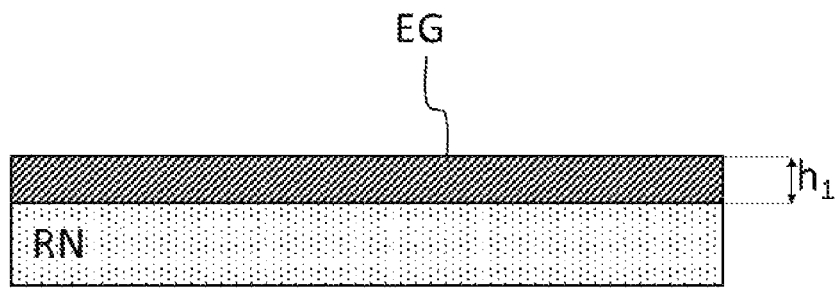
[Fig. 12B]
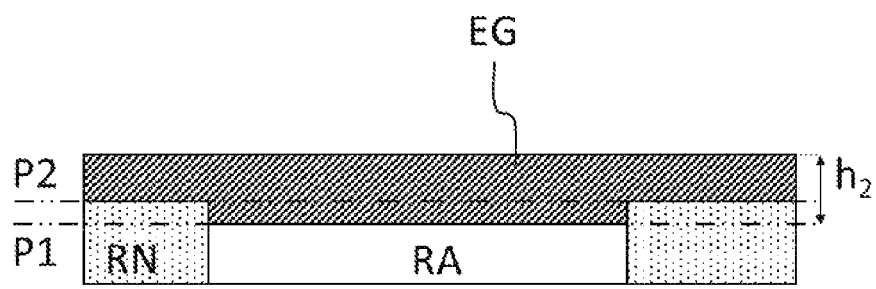

[Fig. 13A]
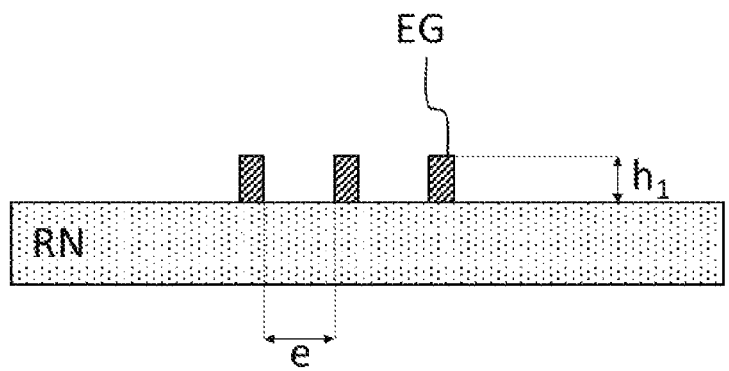
[Fig. 13B]
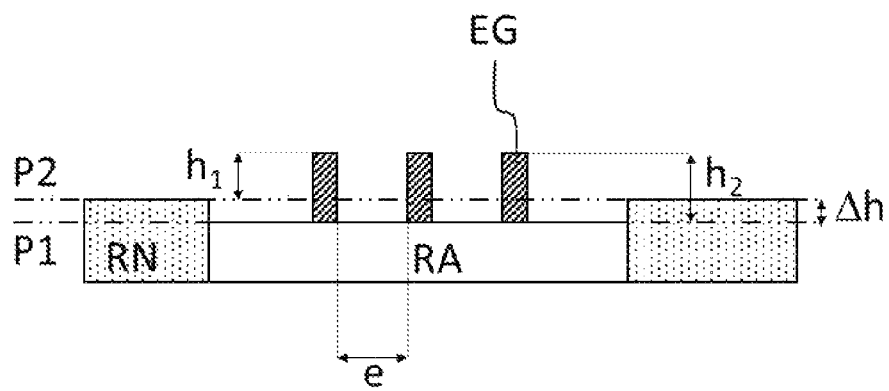

[Fig. 14A]
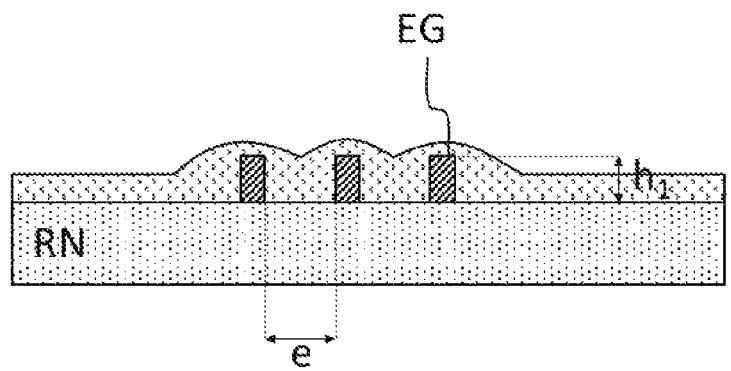
[Fig. 14B]
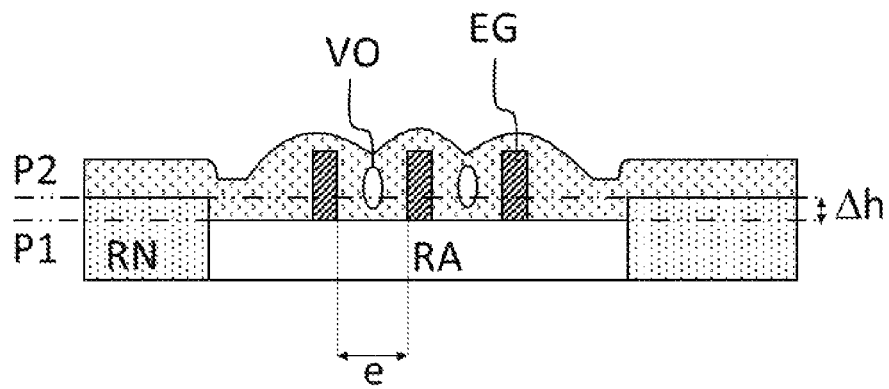

DEVICE COMPRISING SPACERS INCLUDING A LOCALISED AIRGAP AND ASSOCIATED MANUFACTURING METHODS

CROSS-REFERENCE TO RELATED APPLICATIONS

This application claims priority to French Patent Application No. 2110869, filed Oct. 14, 2021, the entire content of which is incorporated herein by reference in its entirety.

FIELD

The technical field of the invention is that of semiconductor devices, particularly for applications to spin qubits.

The present invention relates to a device comprising spacers including an airgap and in particular to a device in which the airgaps are located. The present invention also relates to two manufacturing methods for obtaining such a device.

BACKGROUND

In the field of semiconductor devices for making spin qubits, it is known to use a plurality of gates disposed one after the other so as to make a plurality of spin qubits which it is then possible to couple together by playing on the potential barriers separating two adjacent qubits.

The distance separating the qubits generally imposes a high density at the gates (typically a pitch of less than 100 nm) so that there is a strong coupling between the different gates, in particular at the active region of the device (the channel), that is, the region in which the spin qubits will be formed. This is even more true since, for manufacturing reasons, the materials used to make the spacers are not low-k materials, which tends to reinforce the coupling between adjacent gates.

In order to reduce the coupling, it is known to make spacers comprising an airgap. This is, for example, provided in document US 2015/0091089 A1 or document US 2014/0110798. However, the methods described in these documents are relatively complex to implement and do not enable the life zone of each spacer to be localised, as this life zone is then present over the entire length of the spacer.

There is therefore a need for a method that allows for the easy manufacture of spacers comprising an airgap and that also enables this airgap to be localised to only a part of the spacer.

SUMMARY

The invention provides a solution to the above-mentioned problems, by making it possible to easily obtain localised airgaps by playing on the form aspect between the height of the gate stacks and the distance separating them.

To this end, a first aspect of the invention relates to a semiconductor device made on a substrate comprising at least one active region and one non-active region at least partially surrounding the active region, a plurality of gate stacks, a part of each gate stack of the plurality of gate stacks being on the active region and a part of said gate stacks being on the non-active region, each gate stack being separated from at least one adjacent gate stack, for example from each adjacent gate stack, by means of a spacer by a distance e, wherein, for each gate stack of the plurality of gate stacks, the part of the gate stack located on the active region has a height $h_2$, the part of the same gate stack located on the non-active region has a height $h_1$, and in that $h_2/e=a_2$ and $h_1/e=a_1$ where $a_2$ is an aspect ratio such that, upon growth of the spacer material forming the spacers, an airgap is in said spacer, and $a_1$ is an aspect ratio such that, upon growth of the spacer material forming the spacers, no airgap is in said spacer.

By means of the invention, it is possible to obtain spacers comprising airgaps localised at the active region of the device. Moreover, as will be shown in the section devoted to the manufacture of such a device, making localised airgaps is greatly facilitated by the clever use of the aspect ratio between the height of the gate stacks and the distance separating said stacks. These vacuum zones make it possible to limit capacitive coupling between gates during electrical operation. They have to be inside the spacer (covered and not uncovered) so as not to lead to the inclusion of metal during the formation of the metal contacts/electrodes In addition to the characteristics just discussed in the preceding paragraph, the device according to a first aspect of the invention may have one or more of the following additional characteristics, considered individually or in any technically possible combination.

In an embodiment, the surface of the active region is located in a first plane and the surface of the non-active region is located in a second plane, the first plane being located at a height lower than that of the second plane, the difference in height $\Delta h$ between the first plane and the second plane being equal to the difference between the height $h_2$ of the gate stacks on the active region and the height $h_1$ of the gate stacks on the non-active region.

In an embodiment, the spacers are formed by a layer of spacer material having a thickness t greater than or equal to 0.3×e, for example 0.4×e, or even 0.5×e.

In an embodiment, the spacer material is silicon nitride.

In an embodiment, the device comprises a plurality of active regions.

In an embodiment, $a_2 \geq 1.5$ and $a_1 \leq 1$.

In an embodiment, the height $h_1$ is between 30 and 50 nm, the height $h_2$ is between 60 and 100 nm and/or the distance e separating two successive gate stacks is between 20 and 40 nm.

A second aspect of the invention relates to a method for manufacturing a semiconductor device from a substrate including at least one active region and one non-active region at least partially surrounding the active region, the surface of the active region being located in a first plane and the surface of the non-active region being located in a second plane, the first plane being located at a height lower than that of the second plane, the method comprising:

a step of forming a plurality of gate stacks parallel to each other, each gate stack being separated from the nearest gate stack(s) by a distance e;

a step of depositing a layer of a spacer material so as to form a spacer between each gate stack;

a step of depositing a layer of a dielectric material;

a mechanical-chemical polishing step so that, at the end of this step, the part of the gate stacks located on the active region has a height $h_2$;

the height between the first plane and the second plane being equal to $\Delta h$, the height $h_2$, the difference in height $\Delta h$ and the distance e separating two gate stacks being chosen so that $h_2/e=a_2$ and $(h_2-\Delta h)/e=a_1$ where $a_2$ is an aspect ratio such that, upon growth of the spacer material forming the spacers, an airgap forms within the spacer, and $a_1$ is an aspect ratio such that, upon growth of the spacer material forming the spacers, no airgap forms within said spacer.

In an embodiment, the mechanical-chemical polishing step comprises:
- a first mechanical-chemical polishing sub-step so as to level the layer of dielectric material;
- a second mechanical-chemical polishing sub-step so that, at the end of this sub-step, the part of the gate stacks located on the active region has a height $h_2$.

A third aspect of the invention relates to a method for manufacturing a semiconductor device from a substrate having at least one active region and one non-active region at least partially surrounding the active region, the surface of the active region being located in a first plane and the surface of the non-active region being located in a second plane, the first plane being located at a height lower than that of the second plane, the method comprising:
- a step of full plate depositing a layer of gate stack;
- a mechanical-chemical polishing step so that, at the end of this step, the layer of gate stack located on the active region has a thickness $h_2$;
- a step of forming, from the layer of gate stack, a plurality of gate stacks parallel to each other, each gate stack being separated from the nearest gate stack(s) by a distance e;
- a step of depositing a layer of a spacer material so as to form a spacer between each gate stack;
- the difference in height between the first plane and the second plane being equal to $\Delta h$, the thickness $h_2$, the difference in height $\Delta h$ and the distance e separating two gate stacks being chosen such that $h_2/e=a_2$ and $(h_2-\Delta h)/e=a_1$ where $a_2$ is an aspect ratio such that, upon growth of the spacer material forming the spacers, an airgap forms within said spacer, and $a_1$ is an aspect ratio such that, upon growth of the spacer material forming the spacers, no airgap forms within the spacer.

In addition to the characteristics just discussed in the preceding paragraphs, the method according to a second or third aspect of the invention may have one or more of the following additional characteristics, considered individually or in any technically possible combination.

In an embodiment, the spacer material is silicon nitride.

In an embodiment, a thickness t of spacer material such that $t \geq 0.3 \times e$, for example $t \geq 0.4 \times e$, or even $t \geq 0.5 \times e$, is deposited in the step of depositing a layer of spacer material.

In an embodiment, $a_2 \geq 1.5$ and $a_1 \leq 1$.

In an embodiment, the step of depositing the spacer material is performed by plasma-enhanced chemical vapour deposition (PECVD), low-pressure chemical vapour deposition (LPCVD) or sub-atmospheric pressure chemical vapour deposition (SACVD).

The invention and its various applications will be better understood upon reading the following description and examining the accompanying figures.

BRIEF DESCRIPTION OF THE FIGURES

The figures are set forth as an indication and in no way as a limitation of the invention.

FIG. 1A to FIG. 1E illustrate a semiconductor device according to an embodiment of the invention.

FIG. 2A shows the formation of an airgap in the spacer when the form factor of the structure is sufficiently high.

The FIG. 2B shows the absence of formation of an airgap in the spacer when the form factor of the structure is not sufficiently high.

FIG. 3 shows a graphical representation of the form aspects for obtaining an airgap when forming spacers.

FIG. 4 shows a flow chart of a manufacturing method according to a second aspect of the invention.

FIG. 5 to FIG. 9B schematically show the steps of a manufacturing method according to a second aspect of the invention.

FIG. 10 shows a flow chart of a manufacturing method according to a third aspect of the invention.

FIG. 11A to FIG. 14B schematically show the steps of a manufacturing method according to a third aspect of the invention.

DETAILED DESCRIPTION

The figures are set forth as an indication and in no way as a limitation of the invention.

Semiconductor Device with Localised Airgaps

A first aspect of the invention illustrated in [FIG. 1A] to [FIG. 1E] relates to a semiconductor device DI made on a substrate comprising at least one active region RA and one non-active region RA at least partially surrounding the active region RA. As illustrated in [FIG. 1E], when several active regions RA are present, then the non-active region RN at least partially surrounds said active regions RA.

By active region RA, it is meant a region which comprises a layer of semiconductor material, for example silicon, capable of forming, together with the gate stacks EG, a channel as well as the transistor sources and drains. By non-active region RN, it is meant a region that does not comprise semiconductor material capable of forming, together with the gate stacks EG, a transistor channel. A non-active region RN (also known as an isolation zone) can for example consist of or comprise an STI (for Shallow Trench Isolation—a well-known feature in the field). In an embodiment, the substrate is an SOI type substrate. In an embodiment, the active region RA is then formed by a layer of silicon and the non-active region RN is then formed by an STI on SOI.

In addition, as illustrated in [FIG. 1A], the device DI according to an embodiment of the invention comprises a plurality of gate stacks EG, each gate stack EG of the plurality of gate stacks EG being parallel to the other gate stacks EG of the plurality of gate stacks EG. In addition, as illustrated in [FIG. 1B] and [FIG. 1C] (which represent the device DI along section C1 and section C2 respectively), each gate stack EG is separated from the adjacent gate stacks EG by a distance equal to e by means of a spacer ES. In general, as illustrated in [FIG. 1B], a gate stack EG comprises a gate oxide OG (for example silicon oxide), a layer of metal ME on the gate oxide OG (for example titanium nitride) and a layer of polysilicon PS on the layer of metal ME. However, other configurations may be considered.

Furthermore, as illustrated in [FIG. 1A] to [FIG. 1C], each gate stack EG is disposed such that a part of the stack EG under consideration is on the active region RA. As a result, each gate stack EG is also disposed such that a part of the gate stack EG under consideration is on the non-active region RN.

In addition, as illustrated in [FIG. 1D] which represents a view of the device along section C3, for each gate stack EG, the part of the gate stack EG under consideration located on the non-active region RN at a first height $h_1$ and the part of the gate stack EG under consideration located on the active region RA at a second height $h_2$, the second height $h_2$ being higher than the first height $h_1$. In the following, the difference between the second height $h_2$ and the first height $h_1$ will be denoted as $\Delta h$. In an embodiment, the surface of the active region RA is located in a first plane P1 and the surface of the non-active region RN is located in a second plane P2, the first plane P1 being located at a height lower by Δh than that of the second plane P2.

Furthermore, in the device DI according to an embodiment of the invention, for each gate stack EG of the plurality of gate stacks EG, the height $h_2$ of the part of the gate stack EG located on the active region RA and the height $h_1$ of the part of the same gate stack EG located on the non-active region RA satisfy the relationships $h_2/e=a_2$ and $h_1/e=a_1$ where $a_2$ is an aspect ratio such that, upon growth of the spacer material forming the spacers ES, an airgap is in the spacer ES, and $a_1$ is an aspect ratio such that, upon growth of the spacer material forming the spacers ES, no airgap is in said spacer ES.

The notion of a limit aspect ratio is illustrated in [FIG. 2A] and [FIG. 2B]. The structure represented in [FIG. 2A] has an aspect ratio $h_1/e$ equal to the aspect ratio $a_2$ and an airgap VO therefore forms in the spacers ES. In contrast, the structure represented in [FIG. 2B] has an aspect ratio $h_1/e$ equal to the aspect ratio $a_1$ and no airgap VO therefore forms in the spacers ES. Thus, in the device DI according to an embodiment of the invention, each spacer ES separating one gate stack EG from the next has, at the active region RA, an airgap VO.

The aspect ratios $a_1$ and $a_2$ can be easily determined experimentally by depositing the material used to form the spacers ES with different values of the aspect ratio and by noting for which values of the aspect ratio an airgap VO is formed during said deposition. A graph illustrating such a determination is illustrated in [FIG. 3]. In this figure, the pairs of values (e, h) corresponding to points located in the upper zone OK enable the formation of an airgap VO. Therefore, $a_2$ can be chosen among all the aspect ratios associated with the pairs (h, e) located in this upper zone OK. In contrast, the pairs of values (e, h) corresponding to points located in the lower zone KO do not enable the formation of an airgap VO. Therefore, $a_1$ can be chosen from all the aspect ratios associated with the pairs (h, e) located in this lower zone KO. Thus, the pair (e, $h_2$) corresponds to a point located in the upper zone OK whereas the pair (e, $h_1$) corresponds to a point located in the lower zone KO. In an embodiment, the aspect ratio $a_2$ is equal to 1.5 and/or the aspect ratio $a_1$ is equal to 1. In an embodiment $a_2 \geq 1.5$ and $a_1 \leq 1$, or even $a_2 \geq 1.5$ and $a_1 \leq 0.9$.

In an embodiment, the height $h_1$ is between 30 and 50 nm (limits included). In an embodiment, the height $h_2$ is between 60 and 100 nm (limits included). In an embodiment, the distance e separating two successive gate stacks EG is between 20 and 40 nm (limits included).

In an embodiment, each gate stack EG has a width (measured in the same direction as the distance e) of between 10 and 40 nm (limits included).

In an embodiment, the spacers ES are formed by a layer of spacer material, for example nitride, having a thickness t greater than or equal to 0.3×e, for example greater than or equal to 0.4×e, or even greater than or equal to 0.5×e. This ensures that sufficient spacer material is deposited to form a spacer ES comprising an airgap VO. In an embodiment, the thickness t of the layer of spacer material is between 15 and 20 nm (limits included).

In an example embodiment, the thickness of the layer of spacer material is between 15 and 20 nm (limits included), the distance e separating two successive gate stacks is between 20 and 30 nm (limits included), the height $h_2$ is between 60 and 80 nm and the height $h_1$ is between 30 and 40 nm. In an embodiment, the spacer material is a nitride, such as a silicon nitride.

First Manufacturing Method

A second aspect of the invention illustrated in [FIG. 4] to [FIG. 9B] relates to a method 100 for manufacturing a semiconductor device DI from a substrate (illustrated in [FIG. 5]), for example an SOI substrate, including at least one active region RA and one non-active region RN at least partially surrounding the active region RA. In addition, the surface of the active region RA is located in a first plane P1 and the surface of the non-active region is located in a second plane P2, the first plane P1 being located at a height lower than that of the second plane P2. As illustrated in [FIG. 5], the difference in height between the first plane P1 and the second plane P2 is denoted as Δh in the following.

As illustrated in [FIG. 6A] and [FIG. 6B], the method 100 comprises a step 1E1 of forming a plurality of gate stacks EG parallel to each other, each gate stack EG having a height h (higher than the height $h_2$ introduced below) and being separated from the nearest gate stack(s) EG by a distance e.

In general, as illustrated in [FIG. 6A], a gate stack EG comprises a gate oxide OG (for example silicon oxide), a layer of metal ME on the gate oxide OG (for example titanium nitride) and a layer of polysilicon PS on the layer of metal ME. Also, the plurality of gate stacks EG can for example be obtained by depositing the different layers forming a gate stack EG, the layers being subsequently etched so as to obtain the plurality of gate stacks EG. As these steps are well known in the art, they are not detailed in the following.

As illustrated in [FIG. 7A] and [FIG. 7B], the method 100 then comprises a step 1E2 of depositing a layer of a spacer material, for example nitride, so as to form a spacer ES between each gate stack ES, the thickness t of the deposited layer for example being greater than or equal to 0.3×e. In addition, the height h of the gate stacks EG during this step 1E2 is such that $h/e \geq a_2$ where $a_2$ is the previously introduced aspect ratio enabling the formation of airgaps VO. Also, during the deposition of the layer of a spacer material, an airgap VO is formed within the spacers ES between each gate stack EG.

As illustrated in [FIG. 8A] and [FIG. 8B], the method also comprises a step 1E3 of depositing a layer of a dielectric material OX.

As illustrated in [FIG. 9A] and [FIG. 9B], the method 100 further comprises a mechanical-chemical polishing step 1E4 such that, at the end of this step 1E4, the part of the gate stacks located on the active region has a height $h_2$ chosen such that $h_2/e=a_2$. In an embodiment, this step is performed in two sub-steps: a first mechanical-chemical polishing sub-step so as to level the layer of dielectric material OX and then a second mechanical-chemical polishing sub-step so as to expose the top of the gate stacks EG. Obtaining a height $h_2$ at the part of the gate stacks EG located on the active region RA implies, given the difference in height between the active region RA and the non-active region RN, that the part of the gate stacks EG at the non-active region RN has a height $h_2-\Delta h=h_1$. Furthermore, Δh is chosen such that $h_1/e=a_1$ where $a_1$ is the previously introduced aspect ratio and does not enable the formation of airgaps VO.

Also, the mechanical-chemical polishing step 1E4 is implemented such that the airgaps VO formed in the spacers ES at the non-active region become exposed (cf. [FIG. 9A]) while those formed in the spacers ES at the active region RA remain (cf. [FIG. 9B]—that is, are not exposed).

In an embodiment, the method 100 then comprises a step of depositing a layer of material so as to fill the airgaps VO thus exposed. This may be a deposition of a passivation layer.

At the end of this method 100, a device according to the invention is obtained.

Second Manufacturing Method

A third aspect of the invention illustrated in [FIG. 10] to [FIG. 13B] relates to a method 200 for manufacturing a semiconductor device DI from a substrate (illustrated in [FIG. 4]) having at least one active region RA and one non-active region RA at least partially surrounding the active region RA. In the method 200 according to a third aspect of the invention (as before), the surface of the active region RA is located in a first plane P1 and the surface of the non-active region RN is located in a second plane P2, the first plane P1 being located at a height lower than that of the second plane P2. In addition, as illustrated in [FIG. 4], the difference in height between the first plane P1 and the second plane P2 is denoted as Δh in the following.

As illustrated in [FIG. 11A] and [FIG. 11B], the method 200 comprises a step 2E1 of full plate depositing a layer of gate stacks EG. In an embodiment, the layer of gate stack comprises a gate oxide OG (for example, silicon oxide), a layer of metal ME on the gate oxide OG (for example, titanium nitride) and a layer of polysilicon PS on the layer of metal ME.

As illustrated in [FIG. 12A] and [FIG. 12B], the method 200 comprises a mechanical-chemical polishing step 2E2 such that the layer of gate stacks EG located on the active region RA has, at the end of this step 2E2, a thickness $h_2$. Obtaining a thickness $h_2$ implies, given the difference in height between the active region RA and the non-active region RN, that the layer of gate stacks EG at the non-active region RN has a thickness $h_2-\Delta h=h_1$.

As illustrated in [FIG. 13A] and [FIG. 13B], the method 200 comprises a step 2E3 of forming, from the layer of gate stack EG, a plurality of gate stacks EG parallel to each other, each gate stack EG being separated from the nearest gate stack(s) EG by a distance e. Thus, the part of the gate stacks located in the active region RA has a height $h_2$ while the part of the gate stacks located in the non-active region RN has a height $h_1=h_2-\Delta h$. Moreover, $h_2$ is chosen such that $h_2/e=a_2$ and Δh is chosen such that $h_1/e=a_1$ where $a_2$ is an aspect ratio such that, upon growth of the spacer material forming the spacers ES, an airgap VO forms within said spacer ES, and $a_1$ is an aspect ratio such that, upon growth of the spacer material forming the spacers ES, no airgap VO forms within said spacer ES.

As illustrated in [FIG. 14A] and [FIG. 14B], the method comprises a step 2E4 of depositing a layer of a spacer material, for example nitride, so as to form a spacer ES between each gate stack EG. The thickness t of the deposited layer is in an embodiment greater than or equal to 0.3×e. Furthermore, since this deposition step is performed, $h_1/e=a_1$ and $h_2/e=a_2$, an airgap VO is formed in each spacer at the part located on the active region RA.

At the end of this method 200, a device according to the invention is also obtained.

The invention claimed is:

1. A semiconductor device made on a substrate comprising at least one active region and at least one non-active region at least partially surrounding the at least one active region,
   a plurality of gate stacks, a part of each gate stack of the plurality of gate stacks being on the at least one active region and a part of said plurality of gate stacks being on the at least one non-active region,
   each gate stack being separated from at least one of the adjacent gate stacks by a spacer formed of a spacer material by a distance equal to e,
   wherein, for each gate stack of the plurality of gate stacks, the part of the gate stack located on the at least one active region has a height $h_2$, the part of the same gate stack located on the at least one non-active region has a height $h_1$, and wherein $h_2/e=a_2$ and $h_1/e=a_1$
   where $a_2$ is an aspect ratio such that, upon growth of the spacer material forming the spacers, an airgap is in said spacer,
   and $a_1$ is an aspect ratio such that, upon growth of the spacer material forming the spacers, no airgap is in said spacer.

2. The semiconductor device according to claim 1, wherein a surface of the at least one active region is located in a first plane and a surface of the at least one non-active region is located in a second plane, the first plane being located at a height lower than that of the second plane, a difference in height Δh between the first plane and the second plane being equal to the difference between the height $h_2$ of the gate stacks on the at least one active region and the height $h_1$ of the gate stacks on the non-active region.

3. The semiconductor device according to claim 1, wherein the spacers are formed by a layer of spacer material having a thickness t greater than or equal to 0.3×e.

4. The semiconductor device according to claim 1, comprising a plurality of active regions.

5. The semiconductor device according to claim 1, wherein $a_2 \geq 1.5$ and $a_1 \leq 1$.

6. The semiconductor device according to claim 1, wherein the height $h_1$ is between 30 and 50 nm, the height $h_2$ is between 60 and 100 nm and/or the distance e separating two successive gate stacks is between 20 and 40 nm.

7. The semiconductor device according to claim 1, wherein the spacers are of nitride.

8. A method for manufacturing a semiconductor device from a substrate comprising at least one active region and at least one non-active region at least partially surrounding the active region,
   a surface of the at least one active region is located in a first plane and a surface of the at least one non-active region is located in a second plane,
   the first plane being located at a height lower than that of the second plane, the method comprising:
      forming a plurality of gate stacks parallel to each other, a part of each gate stack of the plurality of gate stacks being on the at least one active region and a part of said plurality of gate stacks being on the at least one non-active region, each gate stack being separated from the nearest gate stack(s) by a distance e;
      depositing a layer of a spacer material so as to form a spacer between each gate stack;
      depositing a layer of a dielectric material;
      performing a mechanical-chemical polishing so that, at the end of the mechanical-chemical polishing, the part of the gate stacks located on the active region has a height $h_2$, and the part of the same gate stack located on the at least one non-active region has a height $h_1$;
   a height between the first plane and the second plane being equal to $\Delta h=h_2-h_1$, the height $h_2$, the difference in height Δh and the distance e separating two gate stacks being chosen so that $h_2/e=a_2$ and $(h_2-\Delta h)/e=a_1$ where $a_2$ is an aspect ratio such that, upon growth of the spacer material forming the spacers, an airgap forms within said spacer, and $a_1$ is an aspect ratio such that, upon growth of the spacer material forming the spacers, no airgap forms within said spacer.

9. The method according to claim 8, wherein the mechanical-chemical polishing comprises:
- a first mechanical-chemical polishing so as to level the layer of dielectric material;
- a second mechanical-chemical polishing so that, at the end of the second mechanical-chemical polishing, the part of the gate stacks located on the active region has a height $h_2$.

10. A method for manufacturing a semiconductor device from a substrate comprising at least one active region and at least one non-active region at least partially surrounding the at least one active region,
- a surface of the at least one active region is located in a first plane and a surface of the at least one non-active region is located in a second plane, the first plane being located at a height lower than that of the second plane, the method comprising:
- full plate depositing a layer of gate stack a part of each gate stack of the plurality of gate stacks being on the at least one active region and a part of said plurality of gate stacks being on the at least one non-active region;
- performing a mechanical-chemical polishing so that the layer of gate stacks located on the active region at the end of the mechanical-chemical polishing has a thickness $h_2$, and the part of the same gate stack located on the at least one non-active region has a height $h_1$;
- forming, from the layer of gate stack, a plurality of gate stacks parallel to each other, each gate stack being separated from the nearest gate stack(s) by a distance e;
- depositing a layer of a spacer material so as to form a spacer between each gate stack;
- the difference in height between the first plane and the second plane being equal to $\Delta h = h_2 - h_1$, the thickness $h_2$, a difference in height $\Delta h$ and the distance e separating two gate stacks being chosen so that $h_2/e = a_2$ and $(h_2 - \Delta h)/e = a_1$ where $a_2$ is an aspect ratio such that, upon growth of the spacer material forming the spacers, an airgap forms within said spacer, and $a_1$ is an aspect ratio such that, upon growth of the spacer material forming the spacers, no airgap forms within said spacer.

11. The method according to claim 10, wherein the spacer material is silicon nitride.

12. The method according to claim 10, wherein a thickness t of the spacer material such that t 0.3×e is deposited in the step of depositing a layer of a spacer material.

13. The method according to claim 10, wherein $a_2$ 1.5 and $a_1 \leq 1$.

14. The method according to claim 10, wherein the depositing of the spacer material is performed by plasma-enhanced chemical vapour deposition, low-pressure chemical vapour deposition or sub-atmospheric pressure chemical vapour deposition.

* * * * *